(12) United States Patent
Mei (10) Patent No.: US 6,232,171 B1
(45) Date of Patent: May 15, 2001

(54) TECHNIQUE OF BOTTLE-SHAPED DEEP TRENCH FORMATION

(75) Inventor: Len Mei, Hsinchu (TW)

(73) Assignees: ProMOS Technology, Inc.; Mosel Vitelic Inc., both of Hsinchu (TW); Siemens AG, Munich (DE)

(*) Notice: Subject to any disclaimer, the term of this patent is extended or adjusted under 35 U.S.C. 154(b) by 0 days.

(21) Appl. No.: 09/327,872

(22) Filed: Jun. 8, 1999

Related U.S. Application Data (60) Provisional application No. 60/116,666, filed on Jan. 11, 1999.

(51) Int. Cl.⁷ ............................................. H01L 21/8242
(52) U.S. Cl. .................. 438/246; 438/243; 438/244; 438/245; 438/247; 438/248; 438/249; 438/386; 438/387; 438/388; 438/389; 438/390; 438/391; 438/392
(58) Field of Search ..................... 438/243, 244, 438/245, 246, 247, 248, 249, 386, 387, 388, 389, 390, 391, 392

(56) References Cited

U.S. PATENT DOCUMENTS

| | | | |
|---|---|---|---|
| 5,658,816 | * | 8/1997 | Rajeevakumar ............... 438/386 |
| 6,018,174 | * | 1/2000 | Schrems et al. ............... 257/296 |
| 6,025,225 | * | 2/2000 | Forbes et al. ............... 438/243 |
| 6,025,245 | * | 2/2000 | Wei ............................ 438/386 |

* cited by examiner

*Primary Examiner*—John F. Niebling
*Assistant Examiner*—Jennifer M. Kennedy
(74) *Attorney, Agent, or Firm*—W. Wayne Liauh (57) ABSTRACT

A method for fabricating deep-submicron vertically arranged capacitors is disclosed which allows the capacitor to enjoy an enhanced sidewall surface so as to attain a capacitance of 40 pF or more. The method comprises the steps of: (a) forming an elongated trench into an active region of a substrate, the elongated trench having a sidewall defining the trench inside the substrate; (b) forming a oxide filler layer which fills the deep trench; (c) etching the oxide filler layer to a predetermined depth, to reveal an upper portion of the sidewall above the predetermined depth; (d) forming a nitride sidewall spacer cover the upper portion of the sidewall; (e) etching away the oxide filler layer to reveal the lower portion of the sidewall; (f) using the sidewall spacer as a mask to either selectively etch away the lower portion of the sidewall or cause the lower portion of the sidewall to be subject to a chemical reaction so that the lower portion of the sidewall can be etched away and thus causing the trench width in the lower portion to be enlarged; and (g) removing the chemically altered lower portion of the sidewall if it is not already removed, to form a bottle-shaped deep trench having an enhanced sidewall surface at the lower portion. The sidewall space may be removed or it may remain in the deep trench to prevent leakage.

8 Claims, 10 Drawing Sheets

TECHNIQUE OF BOTTLE-SHAPED DEEP TRENCH FORMATION

The present application claims the priority date of a provisional application filed Jan. 11, 1999, application Ser. No. 60/116,666.

FIELD OF THE INVENTION

The present invention relates to an improved sub-micron and/or deep sub-micro semiconductor device having at least one deep-trench type capacitor, and the method of fabricating the same. More specifically, the present invention relates to a method for enlarging the diameter, or more generally speaking, the circumference or cross-sectional area, of a deep trench, so as to increase the surface area and thus the capacitance of the capacitor that is formed around the side wall of the deep trench. The present invention is most advantageous in making DRAMs (dynamic random access memory) or other semiconductor devices using the 0.20-micron, 0.18-micron, or even smaller geometry technologies that are currently in development. Because of its advantage of being able to provide enlarged diameter with precision and enhanced flexibility, the method disclosed in the present invention can further be extended to two more generations of DRAM with critical dimensions of 0.15 and 0.13 microns, respectively.

BACKGROUND OF THE INVENTION

Capacitors, each of which generally comprises a dielectric layer sandwiched by a pair of conducting plates, are one of the most fundamental components in electronics. The same can also be said in microelectronics. As the trend in the fabrication of semiconductor devices is toward ever-increasing density of circuit components that can be tightly packed per unit area, there are great demands to develop technologies that can reduce the surface area to be taken by individual circuit components. As a result, deep trench technologies have been developed which result in structures, particularly large area capacitors, that are vertically oriented with respect to the plane of the substrate surface. Capacitors can also be formed in a crown-type stacked structure that are arranged in the direction generally parallel to the plane of the substrate surface.

The capacitance value provided by a given capacitor is determined by the following well known formula:

$$C = KA/t$$

where C is the capacitance, K is the relative dielectric constant of the insulator, A is the area of overlay of the conducting plates, and t is the thickness of the dielectric layer.

A deep trench capacitor typically comprises a dielectric layer formed on the sidewalls of a deep trench, which is formed into and surrounded by a highly doped buried plate (which constitutes the first conducting plate), and a highly doped poly fill (which constitutes the second conducting plate), which fills the deep trench. As indicated by the above equation, the capacitance of the deep trench capacitor is determined by the total sidewall surface of the trench, which, in turn, is determined by the diameter, or more specifically the circumference, of the deep trench.

Figure 1:
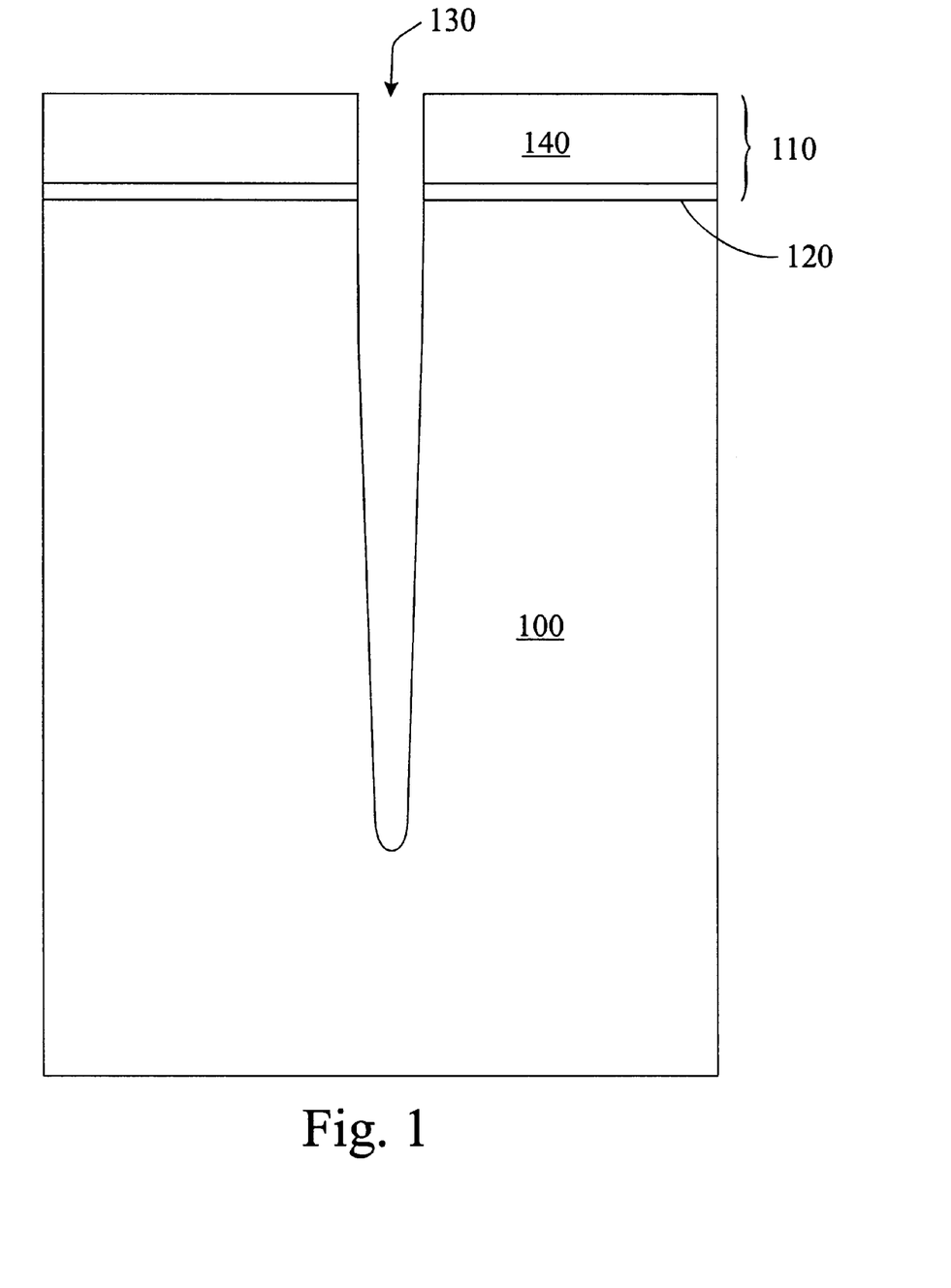
FIG. 1 is an illustrative diagram showing a vertical cross-section of a conventional deep trench having a trench opening of 0.2 $\mu$m and a length of 7.5 $\mu$m.

As the semiconductor fabricating technology moves into deep sub-micron, it is increasingly recognized that the present technology for making deep trench capacitors may be inadequate. For deep sub-micron semiconductor devices, a deep trench can have a length-to-diameter aspect ratio of 35:1 or even greater. With current technology, the diameter (or width or circumference) of the trench generally decreases with depth, as shown in FIG. 1. Such a tapered cross-sectional area causes a significant decrease in the overall sidewall surface of the trench, and, consequently, the capacitance provided by the deep trench capacitor. This problem is expected to become even more profound as we move into the next generation ULSI fabrication technology with a critical dimension of 0.15-micron or even finer.

In an article entitled "0.228 $\mu$m Trench Cell Technologies with Bottle-Shaped Capacitor for 1 Gbit DRAMs", by T. Ozaki, et al, IEDM, 95, PP661–664 (1995), the content thereof in incorporated herein by reference, the authors disclosed a method to increase the diameter of a deep trench. The method disclosed therein includes the steps of: (1) forming an 80 nm collar oxide at the upper portion of the trench by the selective oxidation; (2) performing a capacitor process which includes oxidation mask removal, native oxide removal, etc., during which process the collar oxide thickness reduces to 50 nm; and (3) in-situ phosphorous doped polysilicon is deposited and phosphorous doping into the trench side wall at the capacitor portion (plate electrode) is performed by the furnace annealing technology. The collar oxide prevents phosphorous doping at the upper portion of the trench; it also makes the electrical isolation between the plate electrode and the transfer transistor. The poly-silicon is removed by chemical dry etching and the diameter of the trench under the collar oxide is enlarged at the same time. The authors reported that the trench diameter is enlarged by 30%, thus forming a "bottled-shaped" deep trench.

One of the drawbacks of this technology and all the technologies derived therefrom is that the diameter enlargement is dictated by the differential etch rates between phosphorous-doped polysilicon and silicon. Typically, the phosphorous-doped polysilicon only improves the etch rate by a factor of two relatively to undoped silicon. This is further complicated by the fact that, during the annealing process, the phosphorous ions will laterally to the silicon portion, thus further reducing the etching selectivity causing it difficult to have a sharp boundary. As a result, the Ozaki et al process does not provide enough precision for application in small geometry technologies.

Another main drawback of the Ozaki et al process is that it requires a relatively thick (initially 800 Å) oxide collar to protect the neck portion of the deep trench during the phosphorous-doping and the subsequent etching process. After the etching process to enlarge the bottom portion of the deep trench, the oxide collar remains. Because the relatively thick oxide collar in the Ozaki et al process grows into the sidewall of the deep trench, it further limits the dimension to which the deep trench can be downsized.

The technique invented by Ozaki et al as described in the article mentioned above was incorporated in U. S. Pat. No. 5,849,638, which discloses a method to further enhance the sidewall surface area of a deep trench. The method disclosed in the '638 patent, the content thereof in incorporated herein by reference, includes the steps of: (1) opening a deep trench mask at an angle for the first trench; (2) etching a trench using RIBE (reactive ion beam etching) with the wafer oriented 1 to 16 degrees off axis with respect to the ion source; (3) opening the deep trench mask at an angle for the second trench; (4) etching the trench using RIBE with the wafer oriented 1 to 15 degrees in the opposite direction; (5) oxide collar formation; and (6) chemical down-stream etching (CDE) to isotropically increase the size of the trench. Steps (5) to (6) were taken from and are identical to the procedure disclosed by Ozaki et al, which included the steps of forming an oxide collar and etching the entire trench sidewall not covered by the oxide collar. Again, as discussed above, as with the Ozaki et al technique, the method taught in the '638 patent may not provide enough precision in deep sub-micron applications.

Other prior art references also discuss the methods for fabricating deep trench capacitors for semiconductor applications. These include U. S. Pat. Nos. 5,064,777, 5,168,336, 5,310,289, 5,348,758, 5,525,531, 5,536,675, 5,614,431, 5,627,092, 5,646,063, 5,656,535, 5,674,769, 5,807,761, 5,828,094, 5,831,301, 5,837,575, etc. None of these patents taught or suggested any method that may be utilized to selectively enlarge the sidewall surface of a deep trench with the kind of precision required for deep sub-micron applications.

SUMMARY OF THE INVENTION

The primary object of the present invention is to develop a method for making deep sub-micron deep trench type capacitors with an enhanced sidewall surface so that a capacitance of 40 pF or more can be attained, and the semiconductors that are made from a process incorporating this method. More specifically, the primary object of the present invention is to develop a method for enlarging the sidewall surface of a deep trench with a substantially improved process precision than the prior art processes which depend on the differential etch rate between doped and undoped silicon. With the method of the present invention the sidewall surface enlargement can be optimally and most effectively controlled within a lower portion of the sidewall where a tapered-down trench diameter distribution is encountered due to the substantially reduced trench opening in a deep sub-micron semiconductor device and the large aspect ratio (i.e., length-to-diameter ratio) of the vertically oriented trench.

In other words, the present invention intends to solve that problem that has been observed in forming vertically arranged capacitors typically provided in the fabrication of DRAMS in that a substantial disparity in the trench diameter is often observed between the upperportion and the lower portion of a deep trench. Such a disparity becomes more noticeable in deep sub-micron semiconductor devices, as the trench diameter tapers at a greater rate from the top to the bottom of the trench. Unlike the method disclosed by Ozaki et al, which provides the surface enlargement through the differential etch rate between doped polysilicon and undoped silicon, the present invention allows a sudden increase in the trench width at an optimum position from the substrate surface. With the Ozaki et al method, only limited sidewall surface enhancement can be achieved, typically less than 30%. The Ozaki et al method also requires that a relatively thick oxide collar be formed into the sidewall, so as to allow the formation of the in-situ phosphorous doped polysilicon below the silicon sidewall protected by the oxide collar. With the present invention, the sidewall surface enlargement can be 50% or greater, and no such oxide collar is required. Furthermore, the present invention allows a bottle-shaped deep trench to be formed with substantially improved and better defined boundary.

In summary, in the method disclosed in the present invention, no phosphorous diffusion is required. And, partly as a result thereof, the surface enhancement can be designed according to an optimal manner. With the method of the present invention, the profile of the sidewall is changed. The upper portion of the sidewall is unaffected, while the lower portion, which has a substantially smaller diameter, can be enlarged by 100% or more. The absence of the in-sidewall oxide collar in the step to form a selectively etchable sidewall penetration in forming the bottle-shaped deep trenches of the present invention also eliminates the need to sacrifice any sidewall surface in order for enlargement in other areas of the trench.

While the method disclosed in the present invention is most useful for fabricating deep trench type (i.e., vertically arranged) capacitors, it can also be advantageously utilized in other applications. When it is incorporated in the process for making deep trench capacitors, the method disclosed in the present invention typically can comprise the following steps:

(1) Forming a deep trench into an active (i.e., conducting) region in a substrate; the present invention is most effective, in terms of the relative benefits that can be achieved, when the trench has a diameter or width less than 0.25 $\mu$m and an aspect ratio greater than 30.

(2) Filling the deep trench with an dielectric material, typically an oxide.

(3) Etching the dielectric material down to a predetermined depth.

(4) Forming a thin oxidative layer, typically using a thermal oxidation procedure, on the sidewall of the trench above the dielectric material and on the top surface around the trench for stress relief.

(5) Forming a nitride layer covering the thin oxide layer. The thin oxide layer provides the required adhesion between the nitride layer and the silicon sidewall.

(6) Using an anisotropic etching procedure to form a nitride sidewall spacer from the nitride layer.

(7) Removing the dielectric material by a selective wet etching to expose the sidewall of the trench below the nitride sidewall spacer.

(8) Using the nitride sidewall spacer as a mask, thermally oxidizing the portion of the substrate behind the sidewall of the trench below the nitride sidewall spacer to a predetermined penetration.

(9) Removing the oxidized silicon sidewall and the nitride sidewall spacer, either simultaneously or separately.

It may be desirable to leave the nitride sidewall in the deep trench which has been found to provide an excellent leakage stopper. One of the main advantages of the present invention is that a highly selective etching system (1000 to 1) can be utilized between oxide and silicon, thus a sharp boundary (i.e., in a lateral sense, penetrating into the sidewall of the deep trench) can be formed. This advantage allows the process of the present invention to be extended to the formation of deep submicron bottle-shaped trenches with a much better precision.

After further cleanup steps, a dielectric layer can be deposited on the sidewall surface, followed by the deposition of a highly doped polysilicon filler layer. This would then complete the process for fabricating a deep trench capacitor.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses a method for making deep trenches with an enhanced sidewall surface. One of the most immediate applications of the method disclosed in the present invention is to make improved vertically elongated capacitors for use in semiconductor devices such as DRAMs having a critical dimension of 0.20 $\mu$m or smaller and a length-to-width aspect ratio of 35 or greater. Under these conditions, the diameter of the trench can be substantially reduced at the bottom portion thereof, often falling off to less than 50% of the value at the trench opening. With the method of the present invention, the trench diameter at the bottom portion can be increased by a factor of two or greater, while allowing the trench diameter at the top to maintain substantially unchanged. The method disclosed in the present invention does not require the phosphorous diffusion step and the associated relatively thick oxide collar, it also allows great flexibility in selecting etchable compositions with the optimal etch selectivity as well as etchability.

Thus, the deep trench that can be fabricated using the method of the present invention contains the following characteristics:

(a) an elongated trench formed into a substrate, the elongated trench having an opening with a width (or critical dimension) of 0.25 $\mu$m of smaller, and a length-to-width of 25 or greater, (b) the elongated trench having a sidewall which is divided into an upper portion and a lower portion at a predetermined depth;

(c) a generally sudden increase in the trench width around the predetermined depth when the sidewall extends from the lower portion into the upper portion; and (d) the upper portion of the sidewall does not contain an oxide collar.

The effect of sidewall surface enhancement is most profound when the elongated trench has an opening with a width of 0.20 $\mu$m of smaller, and a length-to-width of 35 or greater. Preferably, the predetermined depth which divides the upper portion and the lower portion of the sidewall is about 1.0 $\mu$m from the substrate surface, and the lower portion of the sidewall near the dividing point is made to have a width that is at least 30%, or more preferably 50%, greater than the width of the adjacent upper portion.

The trench opening can be a circle, a rectangle, an ellipse or any irregular geometry. For a rectangle, the term "width" refers to the short side, and for an ellipse, the term diameter refers to the minor axis. Since the trench opening can be of any geometry, the terms diameter and width are used interchangeably in this disclosure; however, their true meaning should be adjusted according to the actual geometry of the trench opening. In short, when it is described that a width or diameter is increases, it means, in general, that the associated circumference is increased.

According a preferred embodiment of the present invention, the bottle-shaped deep trench can be made generally in the following manner:

(1) Forming a deep trench into a substrate;

(2) Filling the deep trench with a first dielectric material, preferably an oxide, to form a first dielectric filler layer;

(3) Etching the first dielectric filler layer to the predetermined depth;

(4) Forming a sidewall spacer from a second dielectric material which extends from the opening of the trench to the predetermined depth;

(5) Removing the first dielectric filler layer with a selective etching process;

(6) Using the sidewall spacer as a protective mask, selectively etching away or chemically altering the substrate (so that it can be subsequently etched away) behind the sidewall of the deep trench to a second predetermined depth;

(7) Removing the chemically altered substrate by etching if it is not already etched; and (8) Removing the sidewall spacer also by etching to reveal the entire sidewall surface.

According to a preferred embodiment of the present invention, the sidewall spacer can be formed using a process that includes the following steps:

(a) Forming a thin dielectric pad layer on the sidewall of the trench above the first dielectric filler layer and on the top surface around the trench;

(b) Forming a second dielectric layer covering the dielectric pad layer; and (c) Using an anisotropic etching procedure to form a sidewall spacer from the second dielectric layer.

To form a vertically elongated capacitor, the deep trench is formed into an active region of the substrate. Then, after the completion of the above steps and further cleanup, a dielectric layer can be deposited on the sidewall surface, followed by the deposition of a highly doped polysilicon. This would then complete the process for fabricating a deep trench capacitor.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

FIGS. 1 through 9 show, schematically, the main steps of forming a deep trench with enhanced sidewall surface according to a preferred embodiment of the present invention. These drawings are discussed in more detail below.

FIG. 1 shows that a deep trench 130 is formed, using an isotropic dry etching procedure, into a substrate 100, which also contains, on the top thereof, a very thin pad oxide layer 120 having a thickness of about 50 Å and a relatively thick nitride layer 140 having a thickness of about 2000 Å. Collectively, the pad oxide layer 120 and the nitride layer 140 constitute a pad layer 110. In Example 1, the trench has a trench opening of 0.2 μm and a length of 7.5 μm. The trench width tapers from 0.2 μm at the top to about 0.1 μm at the bottom, due to the limitations of the currently available anisotropic technology when applied to the small trench opening and the large length-to-width ratio encountered in fabrication deep sub-micron semiconductor devices. The oxide layer can be a silicon oxide layer, formed by thermal oxide growth. The nitride layer can be a SiN layer, formed by low pressure chemical vapor deposition (LPCVD) using $SiH_2Cl_2$ and $NH_3$ as reactants. The nitride layer can be used as an etch mask in subsequent oxide etching processes. The trench can be formed using an anisotropic dry etching process, such as using a carbon fluoride gas such as $CHF_3$ as the main etching component in a reactive ion etch (RIE) process.

Figure 2:
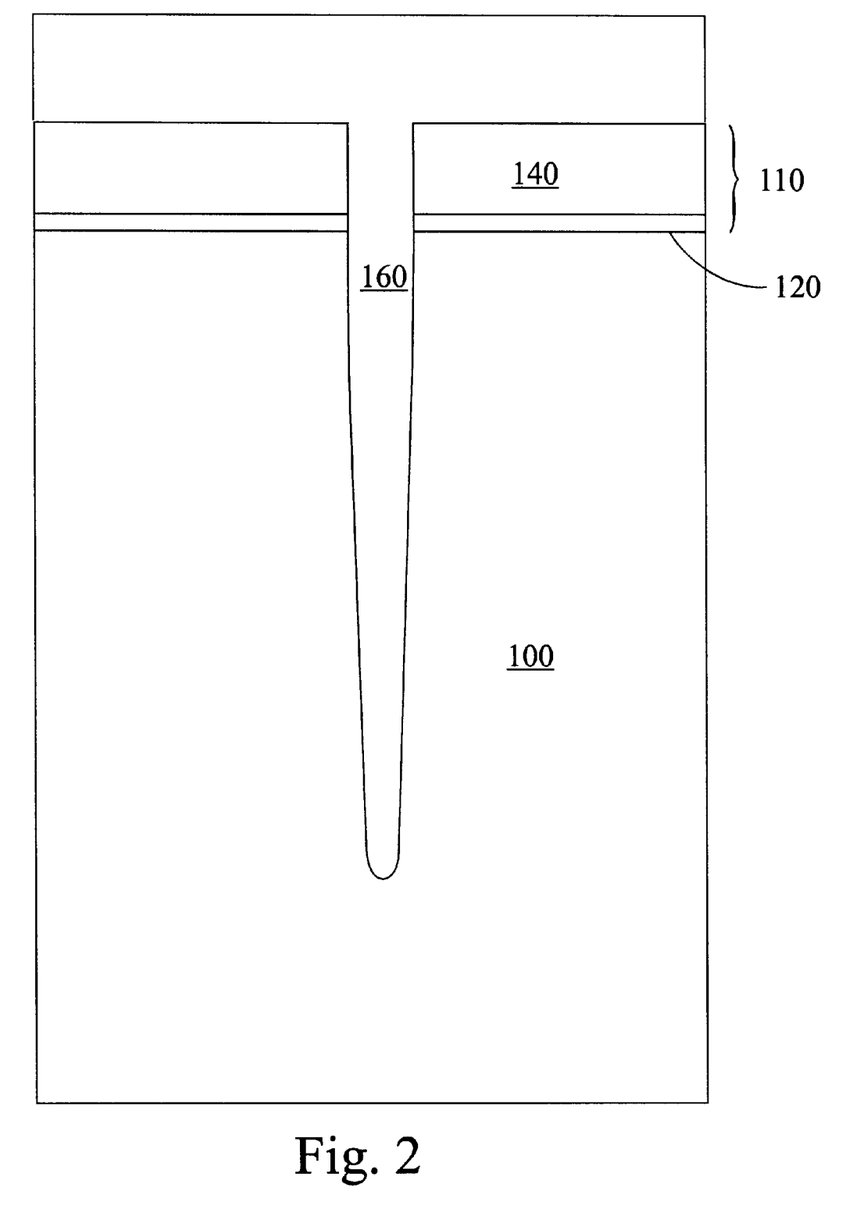
FIG. 2 is an illustrative diagram showing the first step of the process according to a preferred embodiment of the present invention in which a filler oxide is deposited to form an oxide filler layer which fills the trench.
Figure 3:
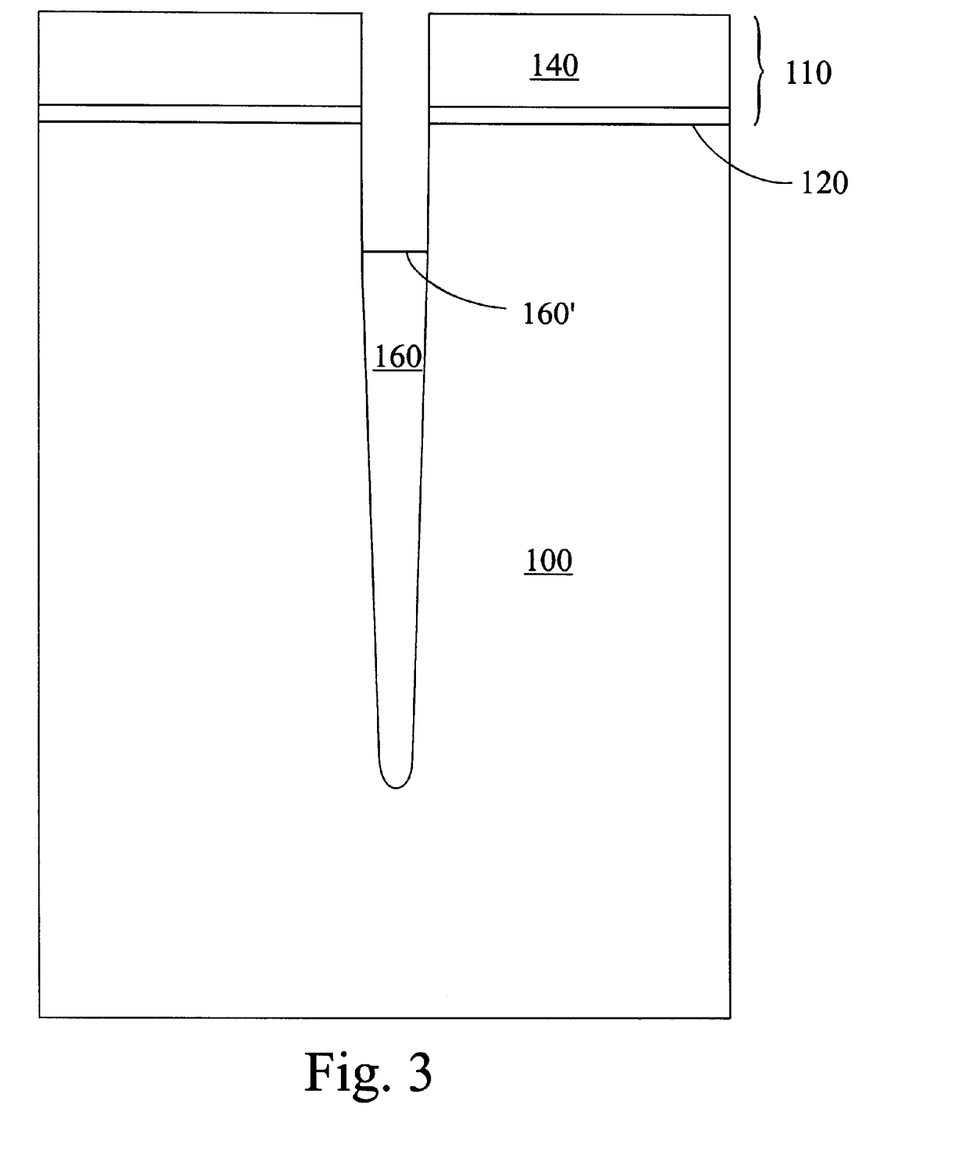
FIG. 3 is an illustrative diagram showing that the filler oxide layer which filled the trench is etched back to a predetermined depth.

FIG. 2 shows that a filler oxide is deposited on the wafer surface to fill the trench and form a filler oxide layer 160. The filler oxide layer is etched back to a predetermined depth 160', as shown in FIG. 3, using a wet oxide etch or dry etch step. This depth marks the threshold of the bottle-shaped trench to be fabricated in the present invention. In this step, the filler oxide should be selected so that it exhibits a high etchability relative to a nitride sidewall spacer that will be subsequently formed, using a selective etcher. The filler oxide layer can be a silicon oxide layer, formed using a high density plasma chemical vapor deposition (HDPCVD) process. The filler silicon oxide layer can be etched backed using buffered hydrofluoric acid in a wet etch process. Hydrofluoric acid reacts very quick with silicon oxide, while leaving the silicon-based substrate unaffected.

Figure 4:
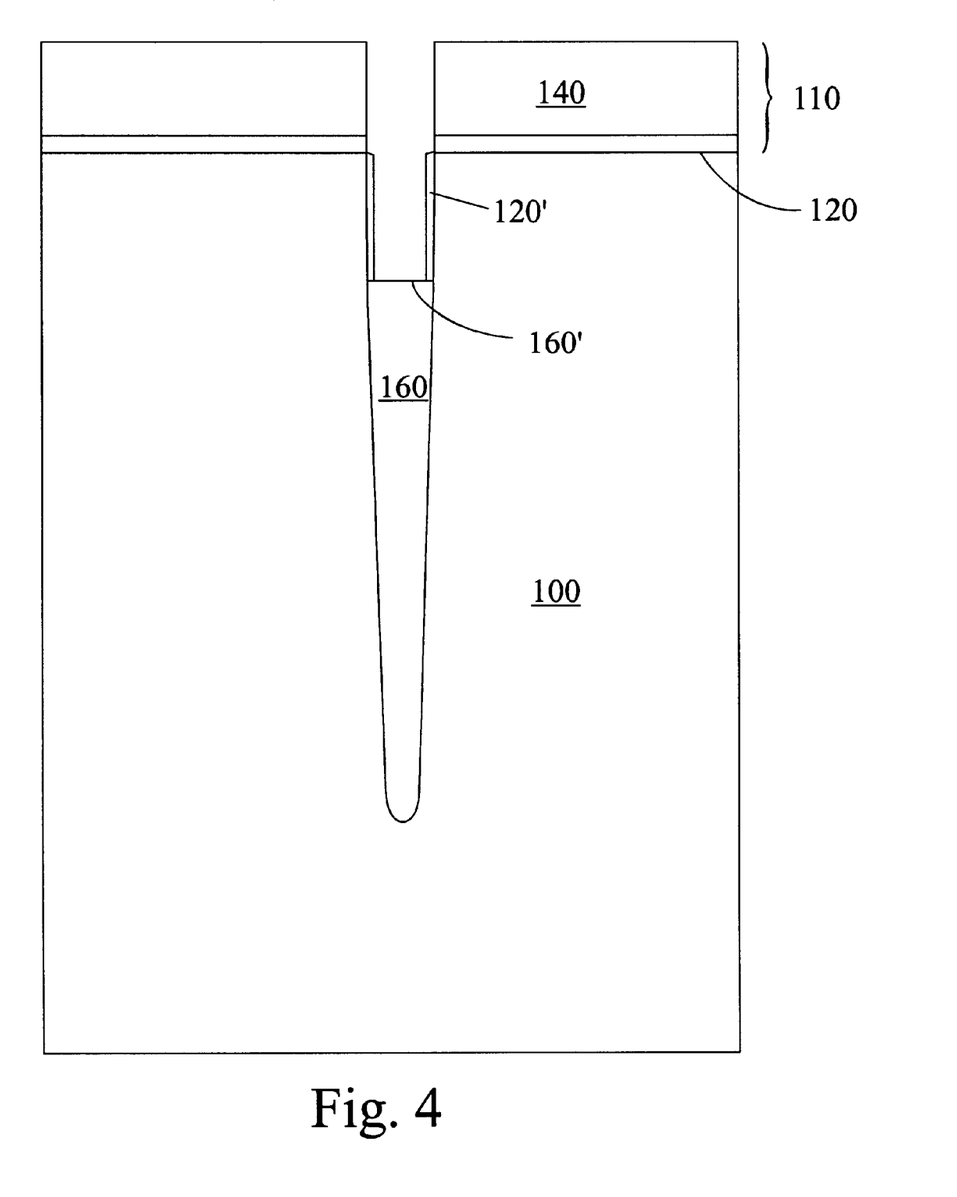
FIG. 4 is an illustrative diagram showing that a pad oxide layer is formed on the sidewall of the deep trench.
Figure 5:
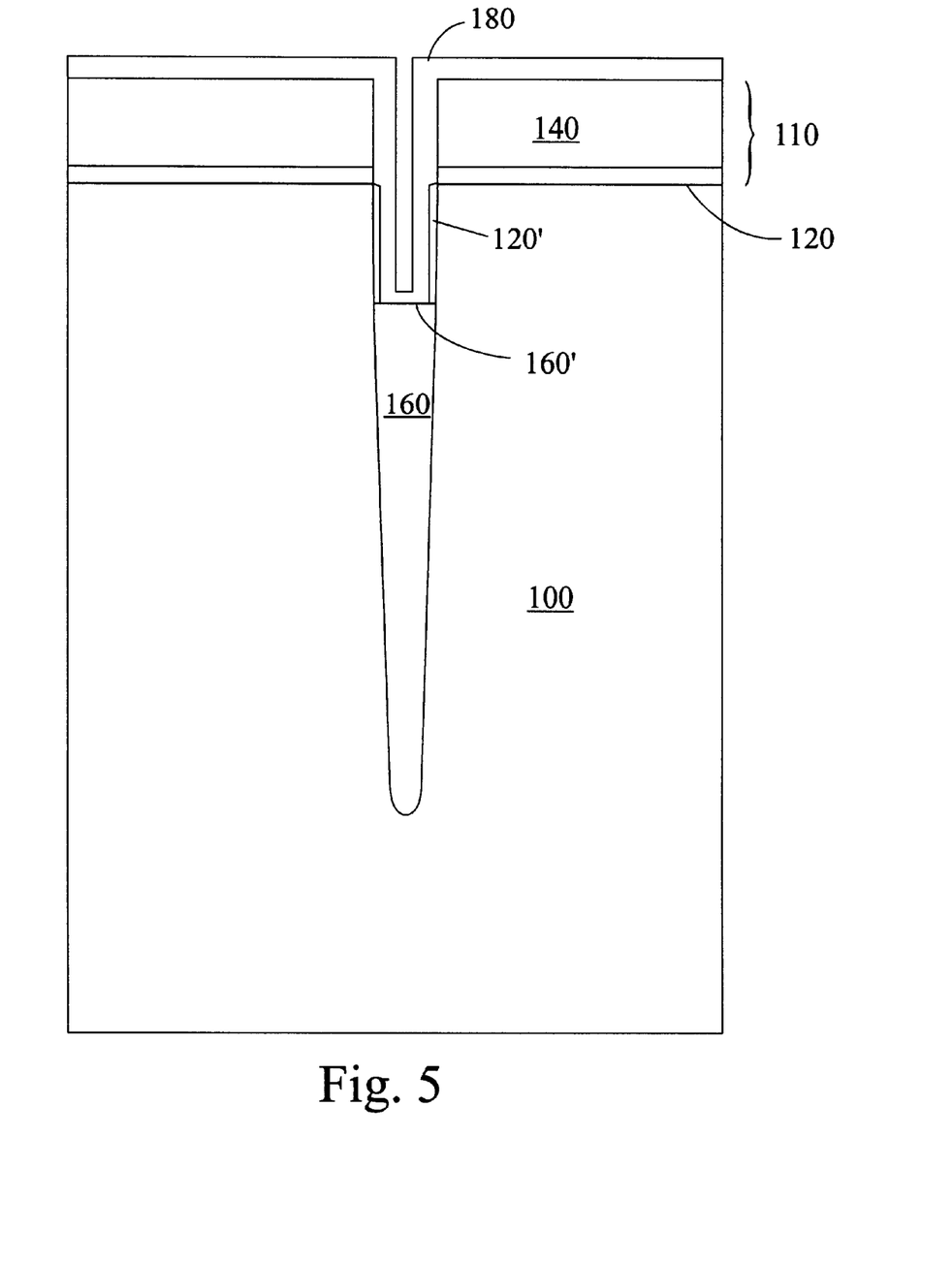
FIG. 5 is an illustrative diagram showing that a nitride layer is formed on the surface of the pad oxide layer at depths above the filler oxide layer.

FIG. 4 a thin vertical pad oxide layer 120' of about 50 Å is formed on the sidewall of the deep trench down to the predetermined depth 160' (i.e., above the oxide filler layer 160), by (thermal) pad oxidation. Subsequently, a nitride layer 180 of about 200 Å thick is formed on the surface of the pad oxide layer and on top of the filler oxide layer, as shown in FIG. 5. It should be noted that the formation of the thin vertical pad layer 120' is optional; its main purpose is to facilitate the eventual removal of the nitride layer 180 from the sidewall of the trench and to improve the adhesion between the nitride layer with the silicon sidewall. The thin vertical pad layer 120' is structurally and functionally different from the oxide collar disclosed in the Ozaki et al capacitor. The latter has a thickness of 500–700 Å, and remains in the sidewall after the completion of the bottle-shaped trench. The pad oxide layer can be formed by thermal oxide growth. The nitride layer can be can be a SiN layer, formed by low pressure chemical vapor deposition (LPCVD) using $SiH_2Cl_2$ and $NH_3$ as reactants.

Figure 6:
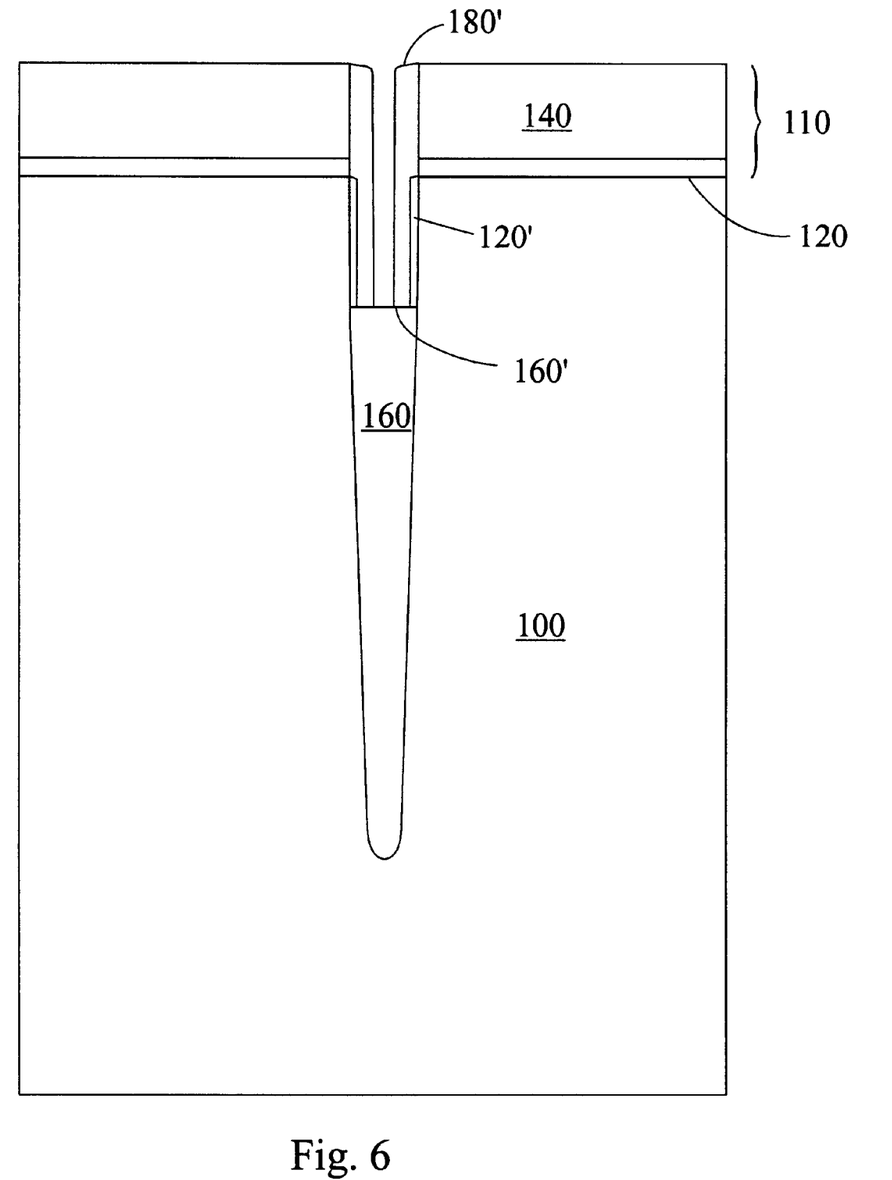
FIG. 6 is an illustrative diagram showing that a nitride sidewall spacer is formed from the nitride layer by anisotropic etching.
Figure 7:
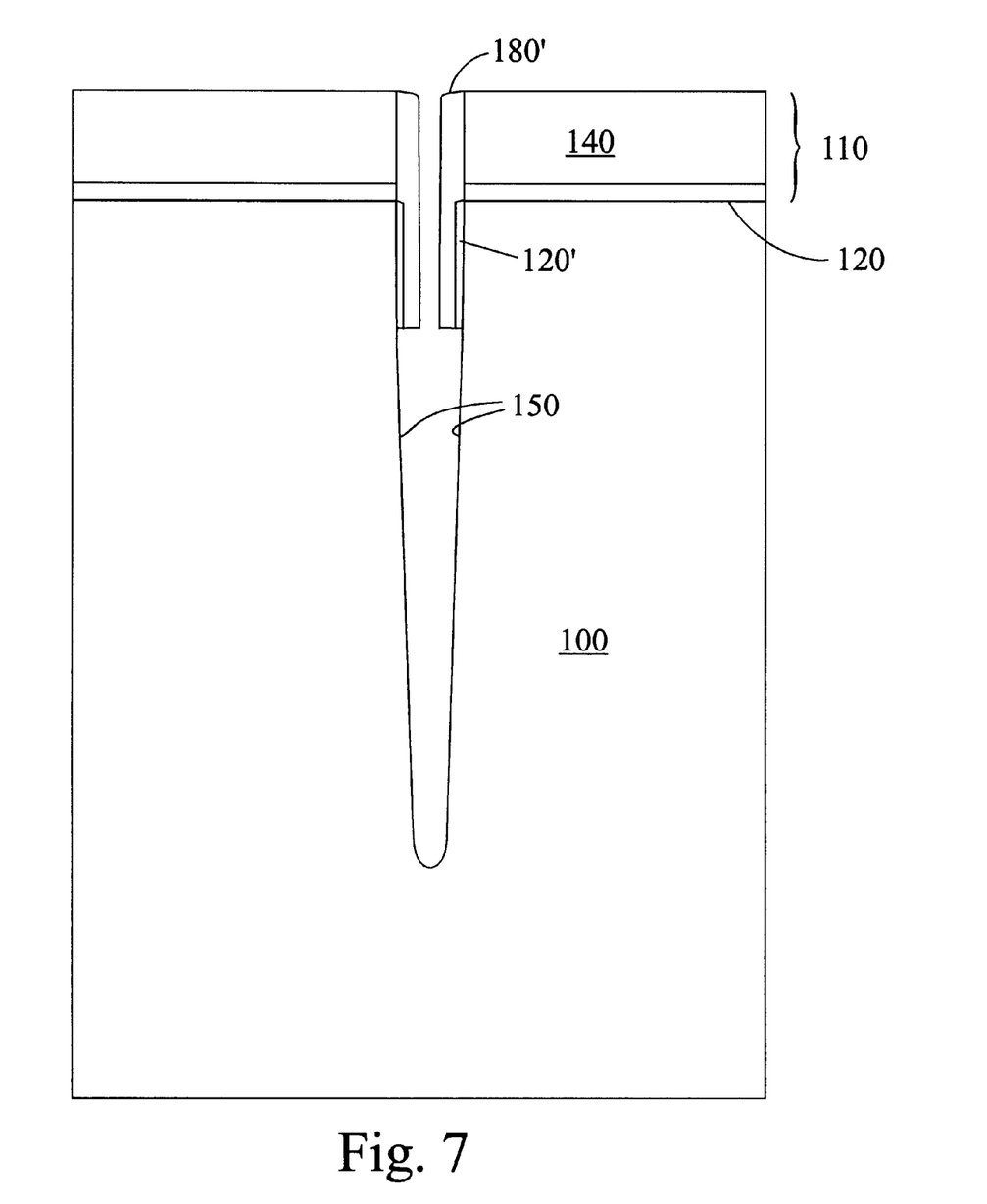
FIG. 7 is an illustrative diagram showing that the filler oxide layer is etched away using a selective etching process leaving the nitride sidewall spacer inside the trench.

FIG. 6 shows that a nitride sidewall spacer 180' is formed from the nitride layer 180 by anisotropic etching, typically using a dry etch process. Because of the different chemical characteristics and thus etchability between the nitride sidewall spacer 180' and the oxide filler layer 160, the oxide filler layer 160 can be subsequently selectively etched away, thus allowing the sidewall surface 150 below the nitride sidewall spacer 180' to be revealed again. This is shown in FIG. 7. Another advantage of the process of the present invention is that the presence of the thick nitride layer 140 allows a greater flexibility of the length of the sidewall spacer 180'. In other words, with the present invention, the sidewall spacer 180' can be designed to have a very short length and still strongly affixed to the trench surface. This allows the trench width to be enhanced over a greater length. The filler oxide layer can be etched using a buffered hydrofluoric acid which has a very high etch selectivity between nitride and silicon oxide.

Figure 8:
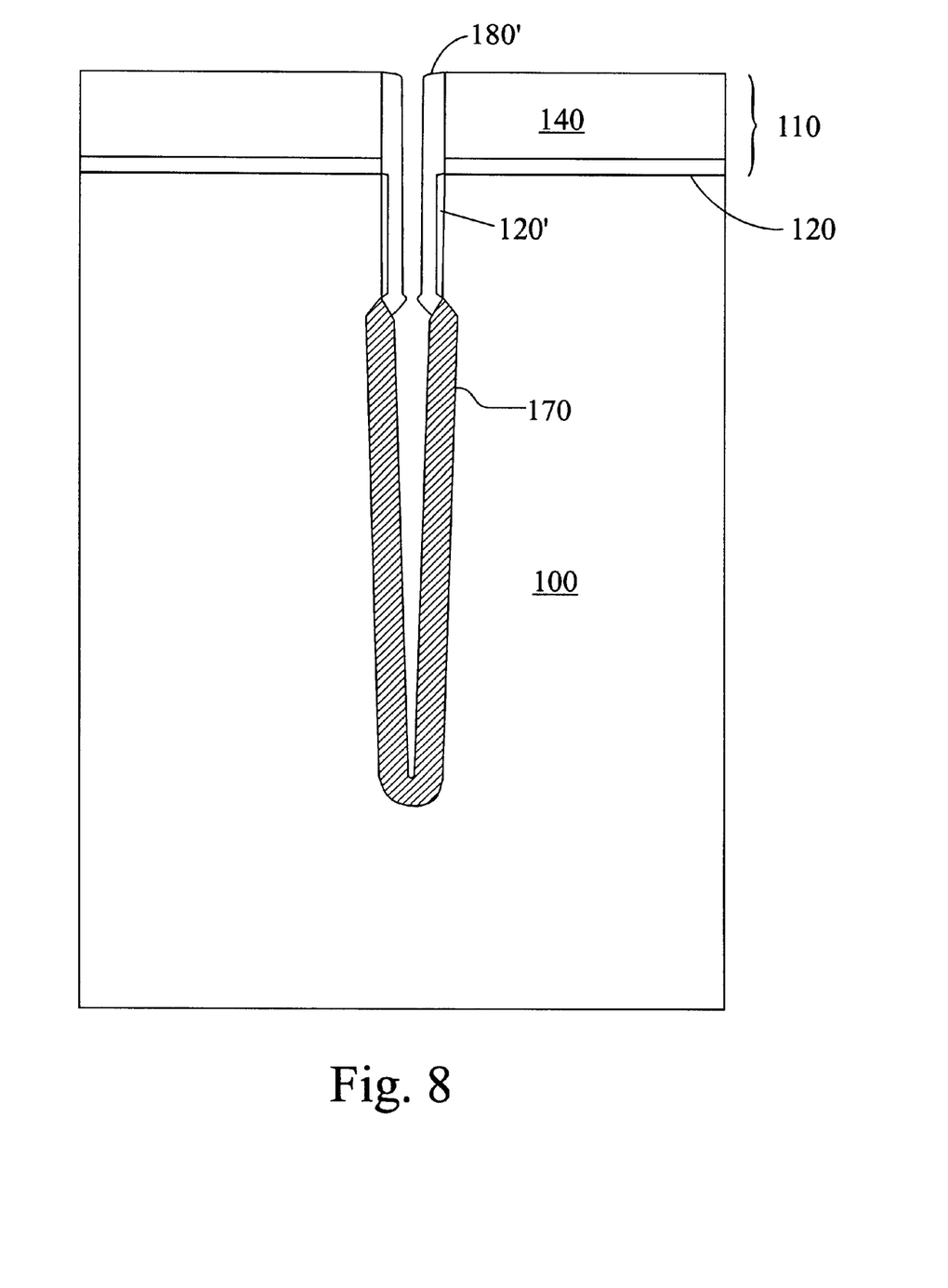
FIG. 8 is an illustrative diagram showing that, by using the nitride sidewall spacer as a mask, the portion of the substrate below the nitride sidewall spacer is thermally oxidized to a predetermined thickness.
Figure 9:
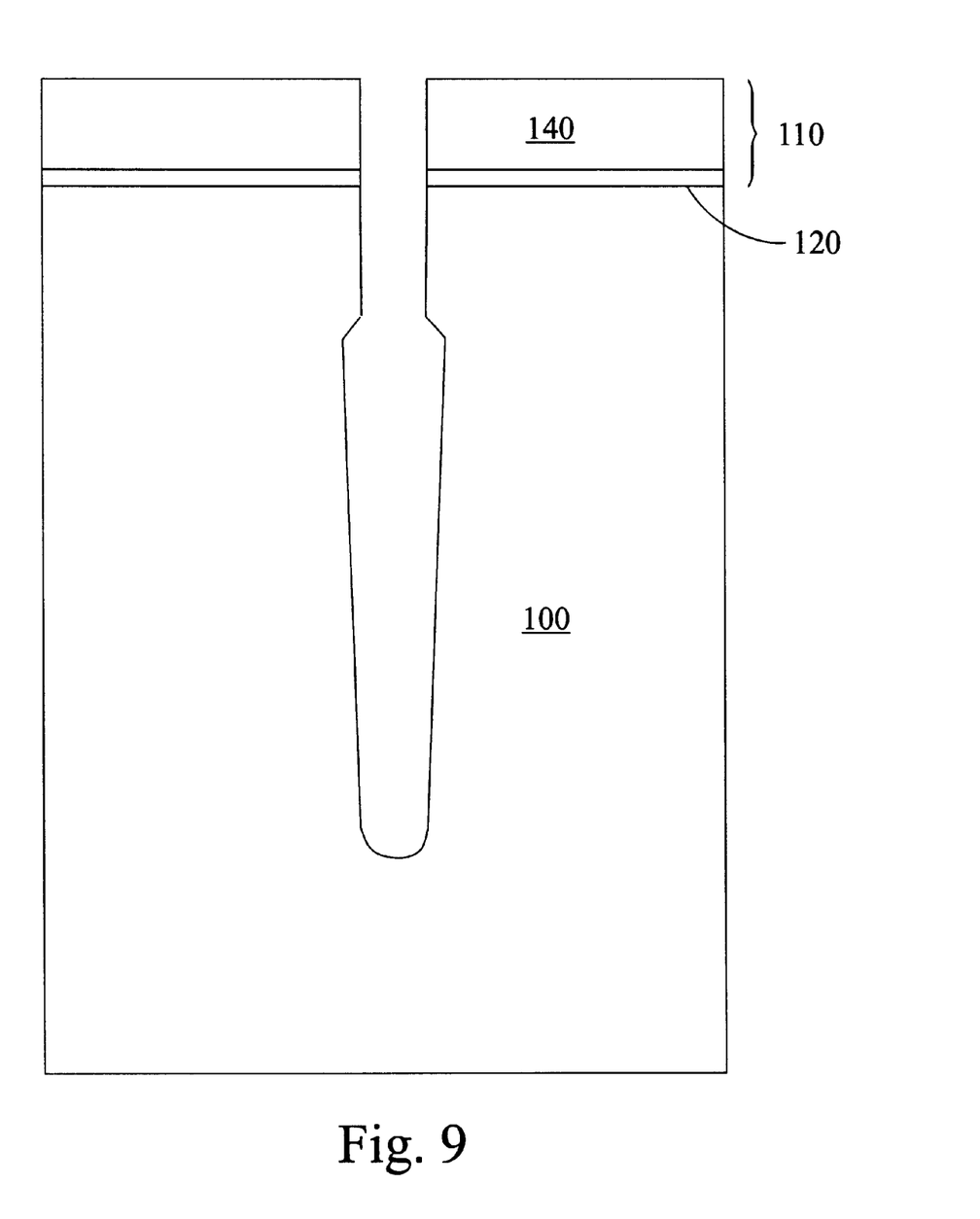
FIG. 9 is an illustrative diagram showing that, after the removal of the nitride sidewall spacer and the thermally oxidized substrate, a bottled-shaped deep trench is formed which includes a sudden enlargement of the sidewall surface below the predetermined depth and which does not contain an oxide collar formed into the sidewall of the trench.

To enlarge the diameter of the deep trench below the predetermined depth, the portion of the substrate behind the sidewall in the lower portion is chemically altered in this example so that it can be readily etched. FIG. 8 is an illustrative diagram showing that, by using the nitride sidewall spacer as a mask, the portion of the substrate below the nitride sidewall spacer is thermally oxidized to a predetermined thickness of about 1,000 Å from the unaffected sidewall surface. Oxide will not grow in areas covered by the nitride sidewall spacer. The thickness of the oxidized zone into the substrate is determined by the extent to which the surface area (i.e., circumference) of the bottom trench is to be enlarged. The oxidized substrate and the nitride sidewall spacer can be simultaneously or separately removed by an etcher, thus allowing a bottled-shaped deep trench to be formed. This is shown in FIG. 9. In this Example, the oxidized zone in the lower portion of the deep trench is first removed by a wet step, followed by a wet nitride removal. The nitride spacer can be removed using a hot phosphoric acid. As shown in FIG. 9, the deep trench with the enhanced sidewall surface does not contain an oxide collar formed into the sidewall of the trench, also the sidewall shows a sudden enlargement in its diameter. The extent of diameter enlargement is about half of the thickness of the oxidized sidewall, or about 500 Å.

Figure 10:
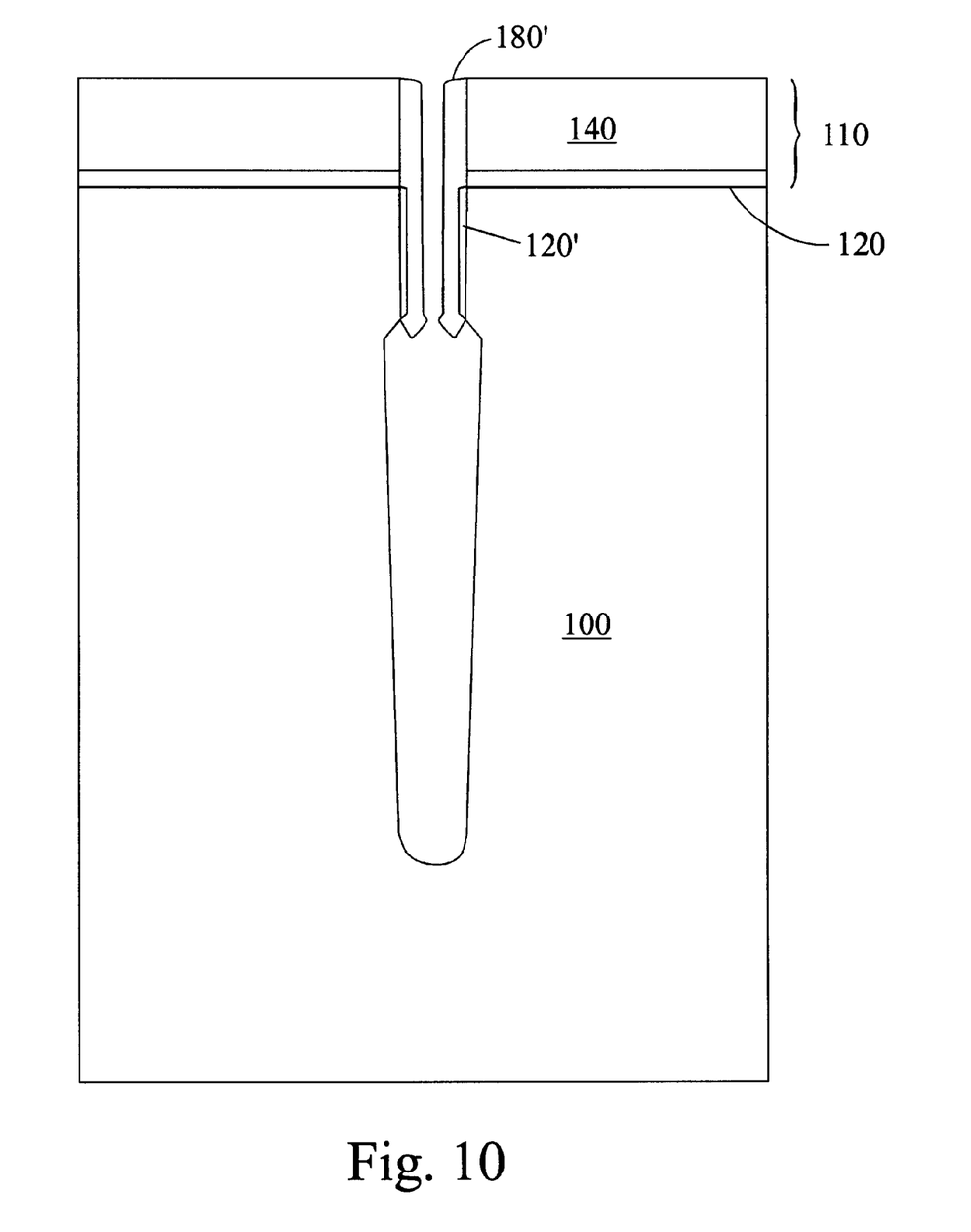
FIG. 10 is an illustrative diagram showing another preferred embodiment of the enhanced deep trench in that the nitride sidewall spacer is not removed and remains in the upper portion of the deep trench. This embodiment improves the elimination of current leaks from the deep trench capacitor.

In another preferred embodiment of the present invention, the nitride sidewall spacer 180' is not removed and remains in the upper portion of the deep trench, and only the oxide 170 is removed by a buffered hydrofluoric acid. This is shown in FIG. 10. This embodiment provides the advantage of preventing leakage from the capacitor.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for fabricating a semiconductor device containing an elongated trench, said process comprising the following steps:

(a) forming an elongated trench into a substrate, said elongated trench having a sidewall which defines said elongated trench inside said substrate;

(b) forming a filler oxide layer by using a filler oxide to fill said elongated trench;

(c) etching said filler oxide layer down to a depth, to reveal an upper portion of said sidewall above said filler oxide layer;

(d) depositing a nitride layer, then using anisotropic dry etching to form a nitride sidewall spacer on said upper portion of said sidewall;

(e) removing said filler oxide layer while leaving said nitride sidewall spacer in place by selective etching, to reveal a lower portion of said sidewall;

(f) using said nitride sidewall spacer as a mask to cause said lower portion of said sidewall to be subject to an oxidation reaction; and (g) removing said oxidized lower portion of said sidewall to form a bottle-shaped elongated trench having an enhanced sidewall surface at said lower portion.

2. The method for fabricating a semiconductor device containing an elongated trench according to claim 1 wherein said oxidation reaction is a thermal oxidation reaction.

3. The method for fabricating a semiconductor device containing an elongated trench according to claim 2 wherein said sidewall spacer is formed using a process which comprises the following steps:

(a) using a chemical vapor deposition process to deposit a nitride layer on said upper portion of said sidewall surface and on top of said oxide filler layer; and (b) using an anisotropic etching procedure to form said sidewall spacer from said nitride layer.

4. The method for fabricating a semiconductor device containing an elongated trench according to claim 3 wherein said process for forming said sidewall spacer further comprises the step of forming a thin oxide layer on said upper portion of said sidewall surface and on top of said oxide filler layer prior to the step of depositing said nitride layer.

5. The method for fabricating a semiconductor device containing an elongated trench according to claim 1 wherein:

(a) said elongated trench is formed into an active portion of said substrate; and (b) said method further comprises the steps of:
(i) forming a dielectric layer on said sidewall surface; and
(ii) depositing a conducting filler layer which fills said elongated trench, so as to allow said trench to function as a capacitor.

6. The method for fabricating a semiconductor device containing an elongated trench according to claim 1 which further comprises the step of removing said sidewall spacer.

7. The method for fabricating a semiconductor device containing an elongated trench according to claim 1 wherein said nitride layer has a thickness of about 200 Å.

8. The method for fabricating a semiconductor device containing an elongated trench according to claim 1 which further comprises the step of forming a pad oxide layer having a thickness of about 50 Å on said sidewall prior to the formation of said nitride layer.

* * * * *